United States Patent
Gonzalez Jimenez

(10) Patent No.: US 9,929,084 B2
(45) Date of Patent: Mar. 27, 2018

(54) DEVICE WITH INTERCONNECTION STRUCTURE FOR FORMING A CONDUCTION PATH OR A CONDUCTING PLANE WITH HIGH DECOUPLING CAPACITANCE

(71) Applicant: Commissariat A L'Energie Atomique et aux Energies Alternatives, Paris (FR)

(72) Inventor: Jose-Luis Gonzalez Jimenez, Voreppe (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/428,502

(22) Filed: Feb. 9, 2017

(65) Prior Publication Data
US 2017/0236778 A1   Aug. 17, 2017

(30) Foreign Application Priority Data
Feb. 11, 2016   (FR) ..................... 16 51108

(51) Int. Cl.
*H01L 23/48*    (2006.01)
*H01L 23/522*   (2006.01)
(Continued)

(52) U.S. Cl.
CPC ...... *H01L 23/5222* (2013.01); *G06F 17/5068* (2013.01); *H01L 23/528* (2013.01); *H01L 23/5226* (2013.01)

(58) Field of Classification Search
CPC ............. H01L 23/5222; H01L 23/5226; H01L 23/528; G06F 17/5068
(Continued)

(56) References Cited

U.S. PATENT DOCUMENTS 6,031,445 A * 2/2000 Marty ................. H01F 27/2804
                                                     257/E21.022
9,322,633 B2 * 4/2016 Yilmaz ................ G01D 5/2405

FOREIGN PATENT DOCUMENTS

EP   0 920 036 A1    6/1999
WO   WO 2008/054324 A1   5/2008
WO   WO 2014/154690 A1   10/2014

OTHER PUBLICATIONS

K. Pantzas et al "Semibulk InGaN: A novel approach for thick, single phase, epitaxial InGaN layers grown by MOVPE", Journal of Crystal Growth 370, 2013, 6 pages.
(Continued)

*Primary Examiner* — Tu-Tu Ho
(74) *Attorney, Agent, or Firm* — Oblon, McClelland, Maier & Neustadt, L.L.P.

(57) ABSTRACT

Electronic device comprising an interconnection structure comprising an alternating stack of arrays of conducting lines and dielectric layers in which:
  all the lines of a same array extend in a same plane and form an equipotential;
  a first pattern of a first array is such that the lines of the first array intersect at several intersections;
  a third pattern of a third array is similar, superimposed and aligned with the first pattern;
  a second pattern of a second array arranged between the first and third arrays is such that the lines of the second array intersect at several intersections offset with respect to those of the first and third patterns;
  a first conducting via extends from a line of the first and/or third array and is not in contact with the second array.

14 Claims, 5 Drawing Sheets

(51) Int. Cl.
    *H01L 23/528*     (2006.01)
    *G06F 17/50*     (2006.01)

(58) Field of Classification Search
    USPC .......................................................... 257/774
    See application file for complete search history.

(56) References Cited

OTHER PUBLICATIONS

F.A. Ponce et al "Microstructure and electronic properties of InGaN alloys", Phys. stat. sol (b), 240, No. 2, 2003, 12 pages.

Mikhail Popovich "High Performance Power Distribution Networks with On-Chip Decoupling Capacitors for Nanoscale Integrated Circuits", Doctoral Dissertation, Department of Electrical and Computer Engineering, University of Rochester, New York, 2007, 91 pages.

French Preliminary Search Report dated Oct. 4, 2016 in French Application 16 51108, filed on Feb. 11, 2016 ( with English Translation of Categories of Cited Documents).

Alain M. Mangan et al. "De-Embedding Transmission Line Measurements for Accurate Modeling of IC Designs", IEEE Transactions on Electron Devices, vol. 53, No. 2, 2006, 7 pages.

Tomonari Shioda et al "Enhanced light output power of green LEDs employing AlGaN interlayer in InGaN/GaN MQW structure on sapphire (0001) substrate", Phys.Status, Solidi A 209, No. 3, 2012, 4 pages.

Jinqiao Xie et al. "On the efficiency droop in InGaN multiple quantum well blue light emitting diodes and its reduction with p-doped quantum well barriers", Virginia Commonwealth University, Applied Physics Letters, vol. 93, 2008, 5 pages.

U.S. Appl. No. 14/709,638, filed May 12, 2015, 2015/0341162 A1, Jose-Luis Gonzalez Jimenez.

U.S. Appl. No. 14/893,848, filed Nov. 24, 2015, 2016/0105190 A1, Alexandre Siligaris et al.

\* cited by examiner

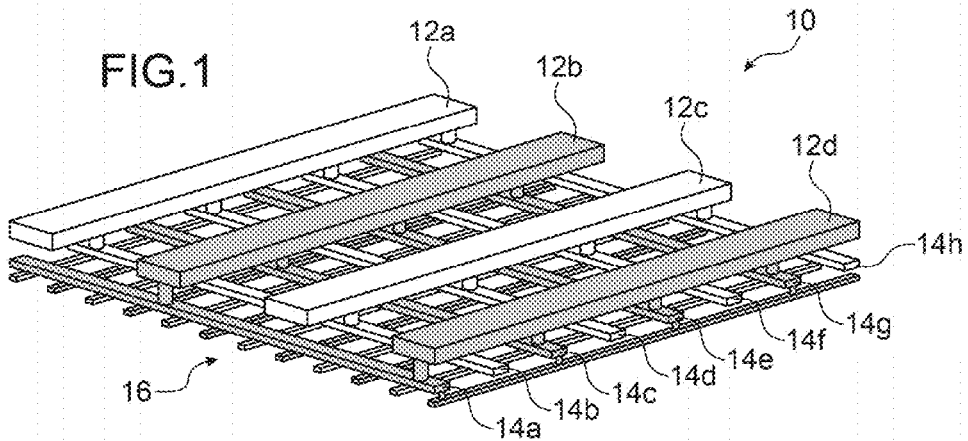
PRIOR ART
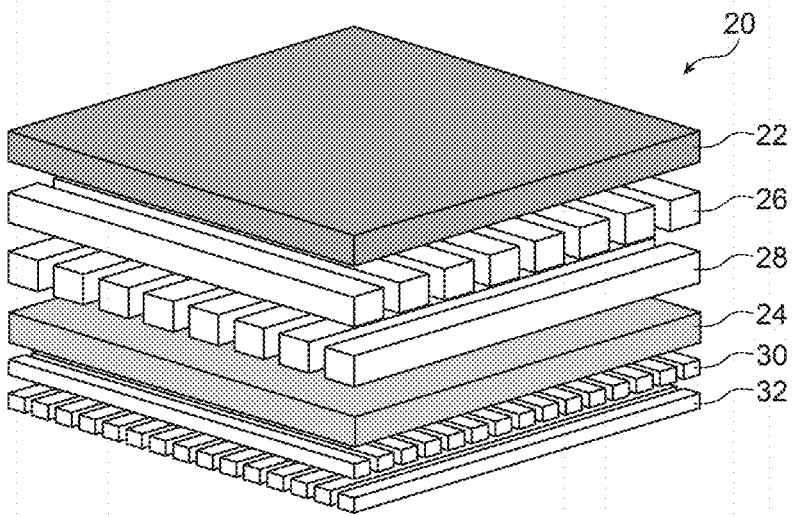
PRIOR ART

DEVICE WITH INTERCONNECTION STRUCTURE FOR FORMING A CONDUCTION PATH OR A CONDUCTING PLANE WITH HIGH DECOUPLING CAPACITANCE

TECHNICAL FIELD AND PRIOR ART

The document relates to an electronic device comprising an interconnection structure enabling the production of at least one conduction path and/or at least one conducting plane, suited to the distribution of several electrical signals and with high decoupling capacitance. Such an interconnection structure advantageously forms part of the back-end, or "back-end of line" (BEOL), of an integrated circuit.

The back-end part of an electronic device such as an integrated circuit is formed by a stack of several metal interconnection levels (generally named, depending on their position occupied with respect to the integrated circuit, METAL 1, METAL 2, etc.) each comprising electrically conducting lines enabling the propagation of signals in the different elements of the integrated circuit. An ILD (Inter-Layer Dielectric) material is arranged between two neighbouring, or successive, metal interconnection levels. The conducting lines of the different interconnection levels are electrically connected together by conducting vias which traverse one or more of the inter-layer dielectric materials depending on the levels to which the conducting lines that have to be connected together belong.

A part of the back-end forms an electrical interconnection structure dedicated to the distribution of electrical supply, polarisation signal(s), and a reference potential or ground potential.

To ensure this distribution, it is known to produce this electrical interconnection structure in the form of a grid, as described in the document "High Performance Power Distribution Networks with On-Chip Decoupling Capacitors for Nanoscale Integrated Circuits" of Mikhail Popovich, Department of Electrical and Computer Engineering, University of Rochester, N.Y., 2007, chapter 4. In such a structure, the conducting lines belonging to a same interconnection level are oriented parallel to each other. In addition, the conducting lines of two consecutive interconnection levels are oriented perpendicularly with respect to each other.

Such an interconnection structure is schematically shown in FIG. 1. In this figure, the interconnection structure 10 comprises three metal interconnection levels. The references 12a to 12d designate the conducting lines of the third interconnection level, the references 14a to 14h designate the conducting lines of the second interconnection level, and the reference 16 designates in a global manner the conducting lines of the first interconnection level (the closest to the integrated circuit on which the interconnection structure is intended to be produced). It may be seen in this figure that in each of the interconnection levels, the conducting lines are parallel to each other, that the conducting lines 12a-12d are parallel to the conducting lines 16, and that the conducting lines 14a-14h are perpendicular to the conducting lines 12a-12d and 16.

In such an interconnection structure, some conducting lines of each interconnection level serve for the distribution of the electrical supply signal and the other conducting lines of each interconnection level serve for the distribution of the reference potential. In FIG. 1, in the third interconnection level, the conducting lines 12a and 12c serve for the routing of the reference potential and the conducting lines 12b and 12d serve for the routing of the supply signal. In the second interconnection level, the conducting lines 14b, 14d, 14f and 14h serve for the routing of the reference potential and the conducting lines 14a, 14c, 14e and 14g serve for the routing of the supply signal. Similarly, some of the conducting lines 16 serve for the routing of the reference potential and the other conducting lines 16 serve for the routing of the supply signal. In each of the interconnection levels, the conducting lines distributing the reference potential and those distributing the supply signal are arranged side by side in an alternating manner. Finally, the conducting lines of two neighbouring levels distributing a same signal (the supply signal or the reference potential) are electrically connected together by conducting vias that enable this distribution of the two signals in all the interconnection levels. Although not shown, inter-layer dielectric materials separate the different levels from each other.

Another example of interconnection structure 20 is shown in FIG. 2. In this structure, the electrical supply voltage is distributed by two interconnection levels, referenced 22 and 24, and produced in the form of continuous conducting planes and not conducting lines spaced apart from each other. The reference potential is distributed by four other interconnection levels, referenced 26, 28, 30 and 32, each formed of conducting lines which are oriented parallel to each other within a same interconnection level. In addition, the conducting lines of the interconnection level 28 are oriented perpendicularly with respect to those of the interconnection level 26. Moreover, the conducting lines of the interconnection level 30 are oriented perpendicularly to those of the interconnection level 32.

In the interconnection structures 10 and 20 described previously, the conducting lines of two neighbouring or successive levels are oriented perpendicularly to each other to form parasitic capacitances between the levels distributing the different signals, and thus to form decoupling capacitances between these signals.

The production of continuous conducting planes, such as the interconnection levels 22 and 24 of the interconnection structure 20 of FIG. 2, is not however authorised by the design rules imposed in most recent integrated circuit manufacturing methods.

The document A. M. Mangan et al., "De-Embedding Transmission Line Measurements for accurate Modelling of IC Designs", IEEE Trans. Electron. Devices, vol. 53, no 2, pp. 235-241, no 2, February 2006, discloses that when it is not permitted to have continuous planes in the interconnection levels, these interconnection levels may be produced in the form of meshings comprising empty parts regularly spread out in order to obtain the metal density defined by the design rules imposed on the design of the structure. This document proposes in particular replacing a conducting plane by two consecutive interconnection levels connected together by conducting vias and produced such that the meshings of these two electrical interconnection levels are offset with respect to each other in order to obtain, seen from above, a structure that can be likened to a continuous conducting plane.

The interconnection structure 10 described previously is generally used for digital integrated circuits. Nevertheless, this interconnection structure 10 is not suited for analogue RF integrated circuits which need to have a greater metal density within the interconnection levels. In addition, this interconnection structure 10 does not make it possible to distribute more than two signals.

The interconnection structure 20 makes it possible to distribute more than two different signals but is not optimised in terms of capacitive decoupling between the different elements propagating the different signals. This problem of capacitive decoupling is not resolved either when two successive levels are produced in the form of offset meshings connected together by conducting vias.

DESCRIPTION OF THE INVENTION

There thus exists a need to propose an electronic device comprising an interconnection structure that is suited to the distribution of two signals or more than two signals in at least one conduction path between at least two points of the device and/or in at least one electrically conducting plane, the architecture of which makes it possible to obtain a very high metal density within all of the interconnection levels, while maximising the capacitive decoupling between the elements distributing the different signals.

To do so, one embodiment proposes an electronic device comprising an electrical interconnection structure forming at least one electrical conduction path between at least two points of the electronic device and/or at least one electrically conducting plane, and comprising an alternating stack of arrays of conducting lines and of dielectric layers in which:
  all the conducting lines of a same array extend in a same plane and form an equipotential;
  a first pattern of the conducting lines of a first array is such that at least one first of the conducting lines of the first array extends along at least one first direction and several second of the conducting lines of the first array intersect the first of the conducting lines of the first array at several intersections;
  a third pattern of conducting lines of a third array is similar to the first pattern, the first and third patterns being superimposed one on top of the other and such that the intersections of the first pattern are aligned with the intersections of the third pattern along an axis substantially perpendicular to the planes in which the conducting lines of the first and third arrays extend;
  a second pattern of the conducting lines of a second array arranged between the first and third arrays is such that at least one first of the conducting lines of the second array extends along the first direction and several second of the conducting lines of the second array intersect the first of the conducting lines of the second array at several intersections offset with respect to the intersections of the first and third patterns;
  at least one first conducting via extends through at least one part of at least one of the dielectric layers interposed between the first and third arrays of conducting lines, is in contact with at least one of the conducting lines of the first array and/or of the third array and is such that a section of the first conducting via projected in a plane in which the conducting lines of the second array pass is not in contact with the conducting lines of the second array (or is spaced apart from the conducting lines of the second array, or is electrically insulated from the conducting lines of the second array).

This interconnection structure thus proposes distributing several signals in at least three superimposed arrays of conducting lines and which make it possible, thanks to the fact that the intersections of the conducting lines of the second array are offset with respect to the intersections of the conducting lines of the first and third arrays (they are aligned one above the other), to connect the conducting lines of the first and third arrays together thanks to the first conducting via(s) which traverse the second array without coming into contact with the conducting lines of the second array.

This structure makes it possible to distribute more than two different signals because each array of conducting lines may be intended to distribute a different signal, unlike structures of the prior art in which the two distributed signals are present in the conducting lines of each level.

Moreover, due to the fact that a same signal can be distributed by several arrays of the structure, for example the first and third arrays when the conducting lines of these arrays are electrically connected together by one or more first conducting vias, this makes it possible to reduce the series impedance of these arrays on account of the multiplication of the current propagation paths of this signal. The use of alternating arrays (first and third arrays for example) to distribute a same signal makes it possible to increase the parasitic capacitance vis-à-vis the other signal(s) distributed by the structure and thus make it possible to increase the common mode decoupling capacitance between the signals distributed by the interconnection structure.

The increase in the coupling capacitance is also due to the patterns of the arrays of conducting lines of the structure. In fact, by considering for example the first and third arrays, due to the fact that the intersections of the second pattern (of the second array) are offset with respect to the intersections of the first pattern (of the first and third arrays), the decoupling capacitance is increased on account of the important surfaces of conducting lines according to the first pattern which are arranged facing each other.

The interconnection structure advantageously makes it possible to distribute in the conducting plane or in the conduction path continuous and/or low frequency signals such as for example the supply and reference (ground) voltages.

This device advantageously applies for RF integrated circuits and/or circuits having high operating speeds in which a ground plane is used at the level of all the parts of the circuit not occupied by active or passive components.

This device also makes it possible to distribute supply and polarisation voltages with great stability and enables strong decoupling between the ground and continuous supply signals.

Finally, this device makes it possible to have sufficient metal density in each level of the interconnection structure to meet the minimum metal densities imposed by the design rules which the resulting circuit has to meet.

The first conducting via(s), which are electrically connected to the first and/or third arrays of conducting lines, also increase this decoupling capacitance because they increase the surface area of conducting material near to the second array.

The intersections of the conducting lines of the second array are offset with respect to the intersections of the conducting lines of the first and third arrays, that is to say that when the intersections of the first, second and third arrays are projected in a same plane parallel to those in which the conducting lines of these arrays extend, the projections of the intersections of the second array are not superimposed on the projections of the intersections of the first and third arrays.

The device may comprise several first conducting vias extending through the dielectric layers interposed between the first and third arrays of conducting lines and each electrically connecting one of the intersections of the first array of conducting lines to one of the intersections of the third array of conducting lines through a conducting portion of the second array which is electrically insulated from the conducting lines of the second array. Apart from the fact that these conducting portions of the second array facilitate the production of the first conducting vias, they also make it possible to increase the decoupling capacitance between the second array and the first and third arrays.

The device may further comprise at least one second conducting via extending through at least one part of at least one of the dielectric layers interposed between the first and third arrays of conducting lines, in contact with at least one of the conducting lines of the second array and such that a section of the second conducting via projected in a plane in which the conducting lines of the first array pass is not in contact with the conducting lines of the first array. This or these second conducting vias make it possible to increase further the decoupling capacitance between the second array and the first and third arrays. In addition, when the interconnection structure comprises at least four arrays of conducting lines, this or these second conducting vias make it possible to connect the conducting lines of the second array to conducting lines of a fourth array (the third array being arranged between the second and fourth arrays) in order that the conducting lines of the second and fourth arrays can distribute a same signal different to that distributed by the conducting lines of the first and third arrays.

The device may comprise several second conducting vias extending through the dielectric layers interposed between the first and third arrays of conducting lines, each being in contact with one of the intersections of the second array of conducting lines and with a conducting portion of the first array which is electrically insulated from the conducting lines of the first array and/or a conducting portion of the third array which is electrically insulated from the conducting lines of the third array. The conducting portions of the first and/or third arrays to which the second conducting vias are connected make it possible to increase the decoupling capacitance between the second array and the first and third arrays.

The first and third patterns of the conducting lines of the first and third arrays may correspond respectively to a first and a third grid layouts aligned and superimposed one on top of the other, and the second pattern of the conducting lines of the second array may correspond to a second grid layout offset with respect to the first and third grid layouts. The second grid layout is offset with respect to the first and third grid layouts, that is to say that the intersections of the lines forming the first and third grid layouts, when they are projected in the plane in which is located the second grid layout, are not superimposed on those formed by the intersection of the lines of the second grid layout.

When the interconnection structure comprises first and second conducting vias and when the patterns of the arrays form grid layouts offset two by two, the first conducting vias can traverse openings formed in the second grid layout and the second conducting vias traverse openings formed in at least one of the first and third grid layouts.

At least one of the first of the conducting lines of one of the arrays may be interrupted. The interconnection structure may thus be produced such that the distribution of at least one of the signals is interrupted at one point at least of the electrical conduction path and/or the electrically conducting plane.

A method is also described for producing an electronic device comprising an electrical interconnection structure forming at least one electrical conduction path between at least two points of the electronic device and/or at least one electrically conducting plane, in which the method comprises a step of computer aided design of the electrical conduction path and/or of the electrically conducting plane from several similar connection cells each modelling a part of an alternating stack of arrays of conducting lines and dielectric layers in which:
  all the conducting lines of a same array extend in a same plane and form an equipotential;
  a first pattern of the conducting lines of a first array is such that at least one first of the conducting lines of the first array extends along at least one first direction and several second of the conducting lines of the first array intersect the first of the conducting lines of the first array at several intersections;
  a third pattern of the conducting lines of a third array is similar to the first pattern, the first and third patterns being superimposed one on top of the other and such that the intersections of the first pattern are aligned with the intersections of the third pattern along an axis substantially perpendicular to the planes in which the conducting lines of the first and third arrays extend;
  a second pattern of the conducting lines of a second array arranged between the first and third arrays of conducting lines is such that at least one first of the conducting lines of the second array extends along the first direction and several second of the conducting lines of the second array intersect the first of the conducting lines of the second array at several intersections offset with respect to the intersections of the first and third patterns;
  at least one first conducting via extends through at least one part of at least one of the dielectric layers interposed between the first and third arrays of conducting lines, is in contact with at least one of the conducting lines of the first array and/or of the third array and such that one section of the first conducting via projected in a plane in which the conducting lines of the second array pass is not in contact with the conducting lines of the second array;
  and in which, during the step of computer aided design of the electrical conduction path and/or of the electrically conducting plane, a plurality of connection cells are juxtaposed and placed in contact laterally with each other to form the electrical conduction path and/or the electrically conducting plane.

The design of the interconnection structure is here implemented from a unit cell connection which is duplicated several times such that the connection cells juxtaposed with respect to each other form the electrical conduction path(s) and/or the electrically conducting plane(s). Each connection cell comprises a part of each of the arrays of conducting lines, corresponding to the different interconnection levels of the structure, and a part of each of the dielectric layers (ILD) of the interconnection structure. The configuration of this interconnection structure makes it possible to obtain an excellent density of connection lines as well as very good decoupling capacitance between the different interconnection levels.

An electronic device is also described comprising an electrical interconnection structure, comprising an alternating stack of dielectric layers and electrically conducting levels each comprising conducting lines forming at least one electrical conduction path between at least two points of the electronic device and/or at least one electrically conducting plane, in which:
  said stack is structured while forming, in a plane parallel to the layers and to the levels of the stack, several identical connection cells, juxtaposed and in contact laterally with each other such that portions of conducting lines of the electrically conducting levels of neighbouring connection cells are in contact and form electrical connections extending parallel to said plane, and in each of the connection cells, said portions of conducting lines of each of the electrically conducting levels are such that by juxtaposing, in said plane, four connection cells while forming a square of which each side is formed by two of the four connection cells, the portions of conducting lines of two of the electrically conducting levels, named first and third electrically conducting levels, between which is arranged another of the electrically conducting levels, named second electrically conducting level, form two first grid layouts aligned with respect to each other along an axis substantially perpendicular to said plane, and the portions of conducting lines of the second electrically conducting level form a second grid layout, and the patterns of the first grid layouts are offset with respect to that of the second grid layout such that first electrically conducting vias electrically connect the portions of conducting lines of the first and third electrically conducting levels through openings formed in the second grid layout and that second electrically conducting vias are electrically connected to the portions of conducting lines of the second electrically conducting level through openings formed in at least one of the first grid layouts.

Each of the connection cells may have a substantially rectangular shape in said plane.

Each of the connection cells may be such that, according to a first configuration:
the portions of conducting lines of the second electrically conducting level form two segments that intersect substantially perpendicularly with respect to each other and the ends of which are arranged at the edges of the connection cell;
the portions of conducting lines of each of the first and third electrically conducting levels are arranged at the edges of the connection cell and form a rectangle delimiting an empty space facing which is located the intersection of the segments formed by the portions of conducting lines of the second electrically conducting level;
or such that, according to a second configuration:
the portions of conducting lines of each of the first and third electrically conducting levels form two segments that intersect substantially perpendicularly with respect to each other and the ends of which are arranged at the edges of the connection cell;
the portions of conducting lines of the second electrically conducting level are arranged at the edges of the connection cell and form a rectangle delimiting an empty space facing which is located the intersection of the segments formed by the portions of conducting lines of each of the first and third electrically conducting levels.

In this case, each of the connection cells may be such that:
according to the first configuration, several of the first electrically conducting vias are arranged at the corners of the rectangles formed by the portions of conducting lines of the first and third electrically conducting levels and one of the second electrically conducting vias is arranged at the intersection of the segments formed by the portions of conducting lines of the second electrically conducting level, or
according to the second configuration, one of the first electrically conducting vias is arranged at the intersections of the segments formed by the portions of conducting lines of the first and third electrically conducting levels and several of the second electrically conducting vias are arranged at the corners of the rectangle formed by the portions of conducting lines of the second electrically conducting level.

According to another variant, each of the connection cells may be such that, according to a first configuration:
the portions of conducting lines of the second electrically conducting level form two segments that intersect substantially at the centre of the rectangle formed by the connection cell in said plane, and the ends of which are arranged at the edges of the connection cell;
the portions of conducting lines of each of the first and third electrically conducting levels form, in said plane, a lozenge the tops of which are arranged at the edges of the connection cell and delimit an empty space facing which is located the intersection of the segments formed by the portions of conducting lines of the second electrically conducting level;
or such that, according to a second configuration:
the portions of conducting lines of each of the first and third electrically conducting levels form two segments that intersect substantially at the centre of the rectangle formed by the connection cell in said plane, and the ends of which are arranged at the edges of the connection cell;
the portions of conducting lines of the second electrically conducting level form, in said plane, a lozenge the tops of which are arranged at the edges of the connection cell and delimit an empty space facing which is located the intersection of the segments formed by the portions of conducting lines of each of the first and third electrically conducting levels.

Each of the connection cells may be such that:
according to the first configuration, several of the first electrically conducting vias are arranged at the corners of the lozenges formed by the portions of conducting lines of the first and third electrically conducting levels and one of the second electrically conducting vias is arranged at the intersection of the segments formed by the portions of conducting lines of the second electrically conducting level, or
according to the second configuration, one of the first electrically conducting vias is arranged at the intersections of the segments formed by the portions of conducting lines of the first and third electrically conducting levels and several of the second electrically conducting vias are arranged at the corners of the lozenge formed by the portions of conducting lines of the second electrically conducting level.

According to another variant, each of the connection cells may be such that:
the portions of conducting lines of each of the first and third electrically conducting levels form two segments each substantially parallel to two of the edges of the connection cell, that intersect substantially perpendicularly with respect to each other at a first intersection and the ends of which are arranged at the edges of the connection cell;
the portions of conducting lines of the second electrically conducting level form two segments each substantially parallel to two of the edges of the connection cell, that intersect substantially perpendicularly with respect to each other at a second intersection which is, in said plane, offset with respect to the first intersections and the ends of which are arranged at the edges of the connection cell.

In this case, the first electrically conducting vias may be arranged at the first intersections and the second electrically conducting vias may be arranged at the second intersections.

According to another variant, each of the connection cells may be such that:

the portions of conducting lines of each of the first and third electrically conducting levels form two first segments arranged at, and parallel to, two first edges opposite to the connection cell, and a second segment extending substantially perpendicularly to the first segments and each of the ends of which is arranged at one of the first edges;

the portions of conducting lines of the second electrically conducting level form two third segments arranged at, and parallel to, two second edges opposite to the connection cell which are perpendicular to the first edges, and a fourth segment extending substantially perpendicularly to the third segments and each of the ends of which is arranged at one of the third edges.

In this case, each of the connection cells may be such that several of the first electrically conducting vias are arranged at first intersections between the second segment and the first segments formed by the portions of conducting lines of the first and third electrically conducting levels, and such that several second electrically conducting vias are arranged at second intersections between the fourth segment and the second segments formed by the portions of conducting lines of the second electrically conducting level.

The electronic device may be such that:

the stack comprises at least four electrically conducting levels arranged in an alternating manner one on top of the other such that the patterns of conducting lines of two levels spaced apart by another of said levels are similar to each other and form grid layouts, and the grid layouts of two successive electrically conducting levels are offset with respect to each other such that the first electrically conducting vias electrically connect the portions of conducting lines forming the first grid layouts through the openings formed in one or more second grid layouts and that the second electrically conducting vias electrically connect the portions of conducting lines forming the second grid layouts through the openings formed in one or more of the first grid layouts.

The interconnection structure may comprise at least one connection cell in which at least one of the electrically conducting levels is interrupted at the level of at least one of the sides of the connection cell such that a signal intended to propagate in said one of the electrically conducting levels of this connection cell cannot be propagated in a portion of said at least one of the electrically conducting levels of at least one other connection cell juxtaposed to said at least one of the sides of the connection cell.

The interconnection structure may comprise at least one connection cell in which the portions of conducting lines of at least one of the electrically conducting levels are electrically connected to the portions of conducting lines of at least one other adjacent electrically conducting level of the connection cell.

A grid layout corresponds to an arrangement that comprises a juxtaposition of lozenges, generally squares.

BRIEF DESCRIPTION OF THE DRAWINGS

The present invention will better understood on reading the description of examples of embodiment given for purely illustrative purposes and in no way limiting, and by referring to the appended drawings among which:

FIGS. 1 and 2 show interconnection structures of the prior art;

Identical, similar or equivalent parts of the different figures described hereafter bear the same numerical reference so as to make it easier to go from one figure to the next.

The different parts shown in the figures are not necessarily according to a uniform scale, in order to make the figures more legible.

The different possibilities (variants and embodiments) must be understood as not being mutually exclusive and may be combined together.

DETAILED DESCRIPTION OF PARTICULAR EMBODIMENTS

Figure 3:
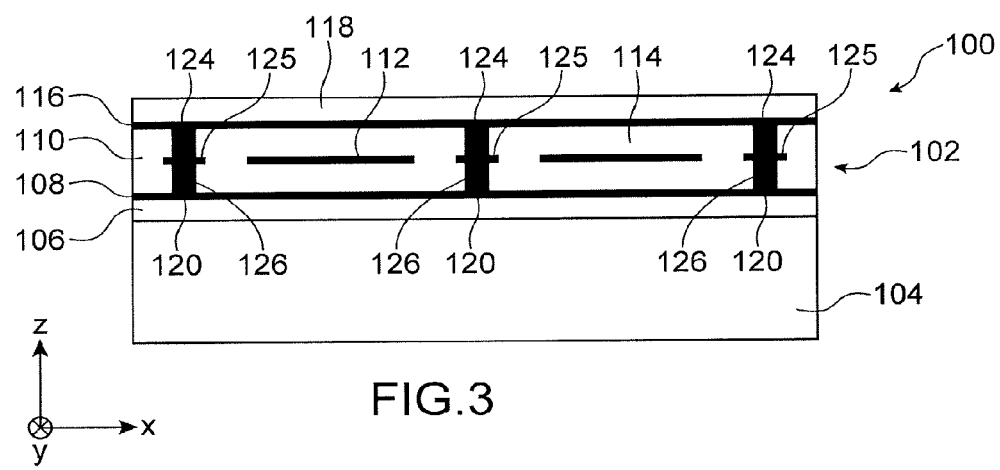
FIG. 3 schematically shows an electronic device according to a particular embodiment.

FIG. 3 schematically shows a side sectional view of an electronic device 100 comprising an electrical interconnection structure 102, according to a particular embodiment.

The device 100 comprises an integrated circuit 104, for example of analogue RF type.

The electrical interconnection structure 102 is arranged on the integrated circuit 104 and forms the back end part of the device 100. The structure 102 is formed of an alternating stack of arrays of conducting lines and dielectric layers (ILD). In the example of FIG. 3, the structure 102 comprises three metallisation levels each forming one of the arrays of conducting lines. This stack comprises:

a first dielectric layer 106 arranged on the integrated circuit 104;

a first metallisation level forming a first array of conducting lines 108 arranged on the first dielectric layer 106;

a second dielectric layer 110 covering the first array of conducting lines 108;

a second metallisation level forming a second array of conducting lines 112 arranged on the second dielectric layer 110;

a third dielectric layer 114 covering the second array of conducting lines 112;

a third metallisation level forming a third array of conducting lines 116 arranged on the third dielectric layer 114;

a fourth dielectric layer 118 covering the third array of conducting lines 116.

One part (not shown) of the structure 102 is used to form the electrical input/output connections of the integrated circuit 104 as well as the electrical connections between the different electronic components of the integrated circuit 104. Another part of the structure 102, described in greater detail hereafter, is used to route an electrical supply signal and a reference potential (ground) at different points of the integrated circuit 104. In the example of embodiment described here, the first and third arrays of conducting lines 108, 116 carry out the routing of the electrical supply signal and the second array of conducting lines 112 carry out the routing of the reference potential.

The arrays of conducting lines 108, 112 and 116 are such that all the conducting lines of a same array extend in a same plane (parallel to the plane (X,Y)) and form an equipotential, that is to say that all of the conducting lines of a same array are at a same electrical potential and distribute a same electrical signal.

Figure 4:
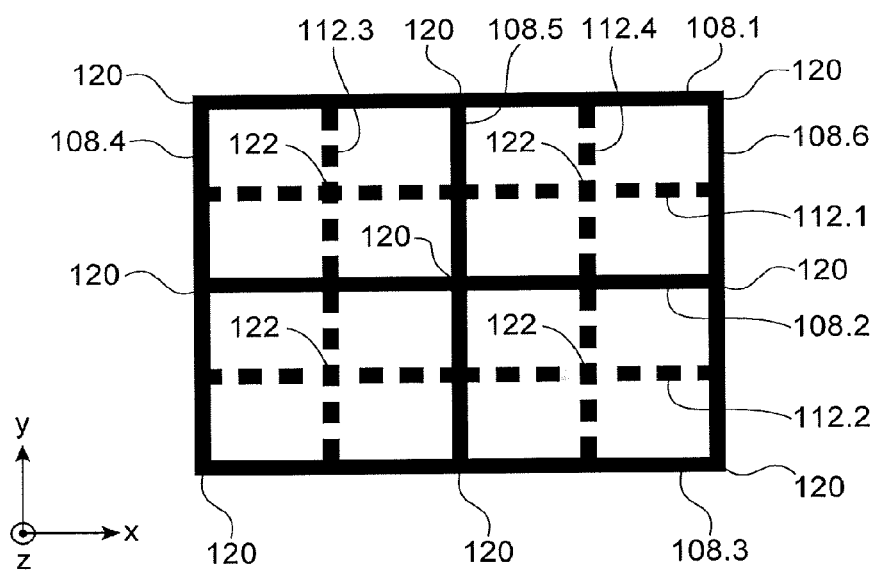
FIG. 4 schematically shows a top view of a part of the arrays of conducting lines of the interconnection structure of an electronic device according to a particular embodiment.

FIG. 4 schematically shows in top view a part of the patterns formed by the arrays of conducting lines of the interconnection structure 102.

The conducting lines 108 of the first array (shown in solid lines in FIG. 4) are produced such that they form, in a plane in which the conducting lines 108 extend (corresponding to the plane (X,Y) of FIGS. 3 and 4), a first pattern corresponding to a first grid layout. In FIG. 4, this first grid layout is formed by the intersection of first conducting lines 108.1, 108.2 and 108.3, extending along a first direction (parallel to the X axis), with second conducting lines 108.4, 108.5 and 108.6 extending along a second direction here perpendicular to the first direction (along the Y axis). The first conducting lines 108.1, 108.2 and 108.3 of the first array intersect the second conducting lines 108.4, 108.5, 108.6 of the first array at first intersections 120.

The conducting lines 112 of the second array (shown in dotted lines in FIG. 4) are produced such that they form, in a plane in which the conducting lines 112 extend (plane (X,Y)), a second pattern corresponding to a second grid layout. In FIG. 4, this second grid layout is formed by the intersection of first conducting lines 112.1, 112.2 extending along the first direction with the second conducting lines 112.3, 112.4 extending along the second direction. The first conducting lines 112.1, 112.2 of the second array intersect the second conducting lines 112.3, 112.4 of the second array at second intersections 122.

The grid layouts formed by the conducting lines 108 and 112 of the first and second arrays are offset with respect to each other such that, seen from above (in a plane parallel to the plane (X,Y)), the first intersections 120 are offset, or non-aligned, with respect to the second intersections 122. In the particular example of embodiment described here, the second intersections 122 are substantially aligned with the centres of the openings, or meshes, of the first grid layout, and the first intersections 120 are substantially aligned with the centres of the openings, or meshes, of the second grid layout. Moreover, the openings of the first grid layout are of dimensions (in the plane (X,Y)) substantially similar to those of the second grid layout.

The conducting lines 116 of the third array, not visible in FIG. 4, are produced such that they form, in a plane in which the conducting lines 116 extend, a third pattern similar to the first pattern formed by the conducting lines 108 of the first array and aligned with the first pattern. Thus, when the interconnection structure 102 is seen from above, the conducting lines 116 of the third array are superimposed on the conducting lines 108 of the first array and thus form a third grid layout which is similar to and superimposed on the first grid layout. As in the first array of conducting lines 108, the third grid layout is formed by the intersection of first conducting lines of the third array extending along the first direction with the second conducting lines of the third array extending along the second direction. The first conducting lines of the third array intersect the second conducting lines of the third array at third intersections 124 which are aligned, parallel to the Z axis, with the first intersections 120.

The first and third arrays of conducting lines 108, 116 being intended to route a same electrical supply signal, these conducting lines 108, 116 are electrically connected together by the first conducting vias 126 formed advantageously between the first and third intersections 120, 124, thus connecting the first intersections 120 to the third intersections 106. In the example of FIG. 3, each first conducting via comprises a first conducting portion traversing the second dielectric layer 110 and a second conducting portion traversing the third dielectric layer 114. The first and second conducting portions of each first via are here electrically connected together thanks to another electrically conducting portion 125 derived from the metal layer serving for the production of the second array of conducting lines 112, these other electrically conducting portions 125 being electrically insulated from the conducting lines 112 of the second array.

In a variant, the first conducting vias 126 may extend not between the first and third intersections 120, 124, but between parts of the conducting lines 108 and 116 of the first and third arrays adjacent to the first and third intersections. Nevertheless, the first conducting vias 126 are arranged such that they are not electrically in contact with the conducting lines 112 of the second array, that is to say extend between the meshes of the second grid layout formed by the conducting lines 112 of the second array without coming into contact with the conducting lines 112.

Advantageously, second conducting vias, not visible in FIGS. 3 and 4, may extend from the second intersections 122 (or from parts of the conducting lines 112 adjacent to the second intersections 122) through the second and third dielectric layers 110, 114. These second conducting vias are arranged such that they are not in contact with the conducting lines 108 and 116 of the first and third arrays, that is to say extend between the meshes of the first and third grid layouts formed by the conducting lines 108, 116 of the first and third arrays. These second conducting vias may be in contact with the electrically conducting portions derived from the metal layer serving for the production of the first array of conducting lines 108 and/or with the electrically conducting portions derived from the metal layer serving for the production of the third array of conducting lines 116, these electrically conducting portions being electrically insulated from the conducting lines 108, 116 of the first and third arrays.

The presence of the first conducting vias 126 between the meshes of the second grid layout formed by the conducting lines 112 of the second array, and potentially second conducting vias between the meshes of the first and third grid layouts formed by the conducting lines 108, 116 of the first and third arrays, is very advantageous because it makes it possible to form very important decoupling capacitances between the different arrays of conducting lines intended to route different signals, that is to say the first and second arrays, and between the second and third arrays.

Prior to the physical production of the interconnection structure 102, the general pattern, or "layout", of this structure is designed during a step of computer aided design of the conduction path(s) and/or of the conducting plane(s) intended to be formed by the structure 102. The geometry of the arrays of conducting lines of the structure 102 is advantageous because it may be produced from individual connection cells which, when they are electrically connected together while arranging them in a manner adjacent to each other, makes it possible to form this or these conduction paths and/or this or these conducting planes.

Figure 5A:
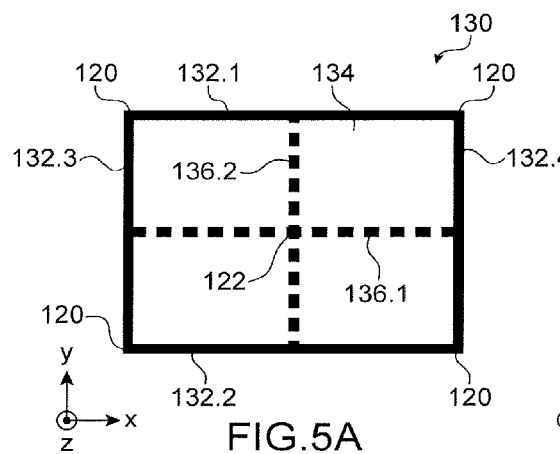
FIGS. 5A to 5D schematically show examples of embodiment of connection cells serving for the production of the interconnection structure of an electronic device.

A first example of embodiment of such an individual connection cell 130 is shown in FIG. 5A.

This cell 130 comprises two portions 132.1 and 132.2 of conducting lines extending along a first direction (parallel to the X axis) and two portions 132.3 and 132.4 of conducting lines extending along a second direction which is here substantially perpendicular to the first direction (parallel to the Y axis). These portions 132.1-132.4 are arranged at the edges of the cell 130 and thus laterally delimit the cell 130. The portions 132.1-132.4 form a rectangle, advantageously a square, delimiting an empty space 134. These portions 132.1-132.4 correspond for example to parts of the conducting lines 108 of the first array or parts of the conducting lines 116 of the third array. Thus, the corners of the rectangle formed by the portions 132.1-132.4 form the intersections 120.

The cell 130 also comprises two portions 136.1 and 136.2 of conducting lines, one extending along the first direction and the other extending along the second direction, that intersect substantially perpendicularly to each other while forming an intersection 122 facing the empty space 134 and the ends of which are arranged at the edges of the cell 130. These portions 136.1, 136.2 define parts of the conducting lines 112 of the second array.

Finally, the cell 130 also comprises portions of conducting lines, not visible in FIG. 5A, superimposed on the portions 132.1-132.4 and defining parts of the conducting lines 116 of the third array.

Thus, by juxtaposing several cells 130 along the X axis and/or the Y axis, a pattern is obtained defining one or more electrical conduction paths or one or more conducting planes formed by the different metallisation levels of the interconnection structure 102. For example, the pattern shown in FIG. 4 may be obtained by juxtaposing four cells 130 according to a square of which each side is formed by two juxtaposed cells 130.

In such a cell 130, four first conducting vias 126 may be arranged at the four intersections 120 and a second conducting via may be formed at the intersection 122.

Figure 5B:
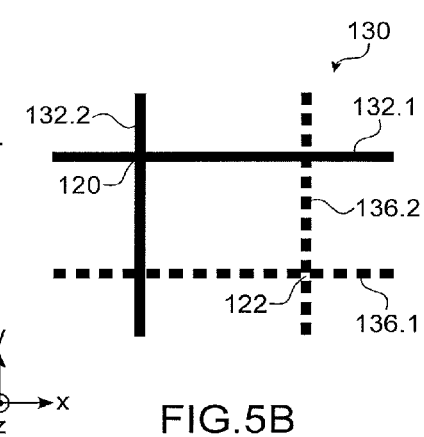

A second example of embodiment of an individual connection cell 130 is shown in FIG. 5B.

This cell 130 comprises two portions 132.1 and 132.2 of conducting lines, one extending parallel to the X axis and the other extending parallel to the Y axis, that intersect substantially perpendicularly with each other at an intersection 120 and the ends of which are arranged at the edges of the cell 130. These portions 132.1 and 132.2 correspond to parts of the conducting lines 108 of the first array.

The cell 130 also comprises two portions 136.1 and 136.2 of conducting lines, one extending parallel to the X axis and the other extending parallel to the Y axis, that intersect substantially perpendicularly with each other at an intersection 122 and the ends of which are arranged at the edges of the cell 130. The intersection 122 is not superimposed on the intersection 120. These portions 136.1, 136.2 define parts of the conducting lines 112 of the second array.

Finally, the cell 130 also comprises portions of conducting lines, not visible in FIG. 5B, superimposed on the portions 132.1, 132.2 and corresponding to parts of the conducting lines 116 of the third array.

As previously, by juxtaposing several cells 130 along the X axis and/or the Y axis, a pattern is obtained defining one or more electrical conduction paths and/or one or more conducting planes formed by the different metallisation levels of the interconnection structure 102.

In such a cell 130, a first conducting via 126 may be arranged at the intersection 120 and a second conducting via may be formed at the intersection 122.

Figure 5C:
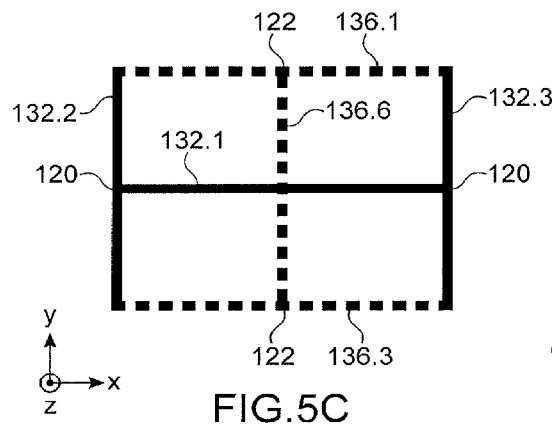

A third example of embodiment of a connection cell 130 is shown in FIG. 5C.

This cell 130 comprises a portion 132.1 of conducting line extending parallel to the X axis and two portions 132.2 and 132.3 of conducting lines extending parallel to the Y axis. The portions 132.2 and 132.3 are arranged at two first edges of the cell 130, and the ends of the portion 132.1 are arranged at the two first edges of the cell 130. The portions 132.2 and 132.3 intersect the portion 132.1 at two intersections 120 located at the two first edges of the cell 130. These portions 132.1-132.3 define parts of the conducting lines 108 of the first array.

The cell 130 also comprises two portions 136.1 and 136.3 of conducting lines extending parallel to the X axis and a portion 136.2 of conducting line extending parallel to the Y axis. The portions 136.1 and 136.3 are arranged at two second edges of the cell 130, and the ends of the portion 136.2 are arranged at the two second edges of the cell 130. The portions 136.1 and 136.3 intersect the portion 136.2 at two intersections 122 located at the two second edges of the cell 130. These portions 136.1-136.3 define parts of the conducting lines 112 of the second array.

Finally, the cell 130 also comprises portions of conducting lines, not visible in FIG. 5C, superimposed on the portions 132.1-132.3 and defining parts of the conducting lines 116 of the third array.

By juxtaposing several cells 130 along the X axis and/or the Y axis, a pattern is obtained defining one or more conduction paths and/or one or more conducting planes formed by the different metallisation levels of the interconnection structure 102.

In such a cell 130, two first conducting vias 126 may be arranged at the two intersections 120 and two second conducting vias may be formed at the two intersections 122.

Figure 5D:
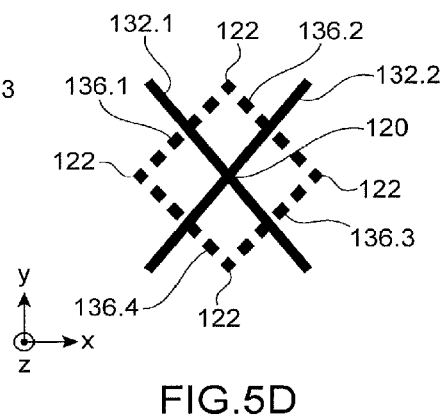

A fourth example of embodiment of a connection cell 130 is shown in FIG. 5D.

This cell 130 comprises two portions 132.1 and 132.2 of conducting lines the ends of which are arranged at the corners of the rectangle formed by the cell 130, and which intersect substantially at the centre of the cell 130 while forming an intersection 120. These portions 132.1 and 132.2 define parts of the conducting lines 108 of the first array.

The cell 130 also comprises four portions 136.1-136.4 of conducting lines forming a lozenge, each of the tops of which is arranged at one of the edges of the cell 130. Each of the tops of the lozenge formed by the portions 136.1-136.4 forms an intersection 122. These portions 136.1-136.4 define parts of the conducting lines 112 of the second array. The portions 136.1-136.4 delimit an empty space facing which is located the intersection 120 of the portions 132.1 and 132.2.

Finally, the cell 130 also comprises portions of conducting lines, not visible in FIG. 5D, superimposed on the portions 132.1 and 132.2 and defining parts of the conducting lines 116 of the third array.

Thus, by juxtaposing several cells 130 along the X axis and/or the Y axis, the portions of conducting lines 132.1-132.2 and 136.1-136.4 are indeed placed in contact with each other at their ends, thus forming in each of the levels one or more first conducting lines extending along at least one first direction and one or more second conducting lines intersecting the first conducting line(s), these conducting lines forming one or more conduction paths and/or one or more conducting planes formed by the different metallisation levels of the interconnection structure 102.

In such a cell 130, five first conducting vias 126 may be arranged at the intersection 120 and the four ends of the portions 132.1 and 132.2, and four second conducting vias may be arranged at the tops of the lozenge defined by the portions 136.1-136.4.

In the different examples described above in relation to FIGS. 5A to 5D, the portions of the conducting lines reach the edges of the cell 130 in order that the juxtaposition of several cells 130 one next to the other, parallel to the X axis and/or to the Y axis, imply placing in electrical contact all of the portions of conducting lines of the cells.

The number of conducting lines located in each of the arrays depends on the surface area intended to be occupied by these arrays of conducting lines to form the conduction path(s) and/or the conducting plane(s) of the device 100.

In a variant of the embodiment described previously, the pattern of the first and third arrays of conducting lines and that of the second array of conducting lines may be reversed. Thus, considering for example the cell 130 of FIG. 5A, the portions 136 corresponding to the second array may form a square similar to that formed by the portions 132 shown in FIG. 5A, and the portions 132 of the first array as well as those of the third array may form a cross pattern similar to that formed by the portions 136 shown in FIG. 5A.

In the embodiment described previously, the conducting lines 108 of the first array are electrically connected to the conducting lines 116 of the third array through the first conducting vias 126. In a variant, it is possible that the first conducting vias only traverse a part of the thickness of at least one of the dielectric layers 110 and 114, and thus that these first conducting vias do not electrically connect together the conducting lines 108 of the first array to the conducting lines 116 of the third array. In this case, the interconnection structure 102 may be able to transmit three different electrical signals, each of these signals being distributed by one of the arrays of conducting lines. Even in this configuration, the conducting vias are useful because they form parasitic capacitances between the arrays and thus increase the decoupling capacitance between the different signals distributed.

Moreover, in the particular embodiment described previously, the structure 102 comprises three metallisation levels each forming an array of conducting lines. The structure 102 may also comprise a greater number of metallisation levels, and thus of superimposed arrays of conducting lines. In this case, the patterns of the conducting lines of additional arrays are similar to those described previously for the first, second and third arrays and such that, considering three successive superimposed arrays among the set of superimposed arrays, the pattern of the array located at the middle of the three is different to the patterns of the two other arrays and the patterns of these two other arrays are similar to each other.

In addition, considering for example that the first conducting vias 126 are connected to the conducting lines of one or more of the odd arrays (first, third, etc.) and that the second conducting vias are connected to the conducting lines of one or more of the even arrays (second, fourth, etc.), the patterns of the conducting lines of these arrays are such that the first conducting vias extend through one or more of the even arrays without being in electrical contact with the conducting lines of this or these even arrays, and such that the second conducting vias extend through one or more of the odd arrays without being in electrical contact with the conducting lines of this or these odd arrays.

All the odd arrays of electrical lines may for example be intended to distribute the same electrical supply signal and all the even arrays of electrical lines may be intended to distribute a same reference potential. A greater number of electrical signals may be distributed by the interconnection structure depending on whether different even or odd arrays are or are not electrically connected together by the first and second conducting vias.

Figure 6:
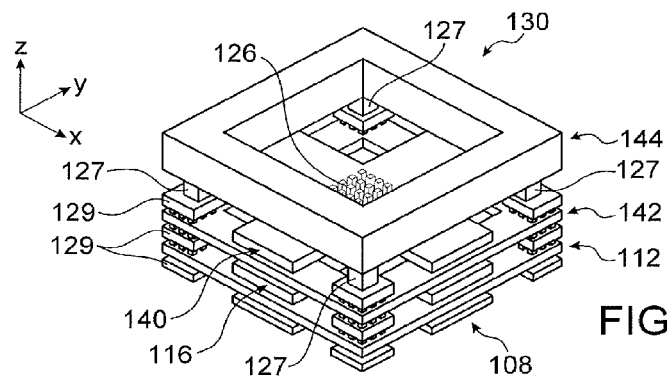
FIGS. 6-9 show other examples of embodiment of connection cells used to form an interconnection structure of an electronic device.

FIG. 6 schematically shows a part of a structure 102 comprising six arrays of superimposed conducting lines, and which corresponds in this figure to a connection cell 130.

This cell 130 comprises portions of a first array of conducting lines 108 of which the pattern, in this cell, corresponds to that of the portions 136 described previously in relation to FIG. 5A, that is to say a cross-shaped pattern of which the intersection is located substantially at the centre of the cell 130 in the plane (X,Y). The ends of the portions of the first array of conducting lines 108 are located at the lateral edges of the cell 130. Portions of a second array of conducting lines 112 are produced according to the pattern corresponding to that of the portions 132 described previously in relation to FIG. 5A, that is to say a pattern forming a square, the portions being arranged at the lateral edges of the cell 130. The cell 130 also comprises portions of a third array of conducting lines 116 and a fifth array of conducting lines 140 of which the pattern is similar and superimposed on that of the portions of the first array of conducting lines 108. Finally, the cell 130 also comprises portions of a fourth array of conducting lines 142 and a sixth array of conducting lines 144 of which the pattern is similar and superimposed on that of the portions of the second array of conducting lines 112.

A first conducting via 126 passes substantially through the centre of the cell 130 and electrically connects the portions of the conducting lines 108, 116 and 140 of the first, third and fifth arrays. It passes through the centres of the squares formed by the portions of the second and fourth arrays of conducting lines 112 and 142 without coming into contact with these portions. In addition, this first conducting via 126 is also in contact with conducting portions (not visible in FIG. 6) located at the same levels as the second and fourth arrays of the conducting lines 112 and 142 but which are not electrically connected to these conducting lines 112 and 142 (such a conducting portion corresponds for example to the portion 125 described previously in relation to FIG. 3). These conducting portions are derived from the same metal layers as those having served for the production of conducting lines 112 and 142.

Four second conducting vias 127 traverse the different arrays of conducting lines near to the four corners of the cell 130 and electrically connect together the portions of the conducting lines 112, 142 and 144. These second conducting vias 127 also pass via conducting portions 129 (in FIG. 6, the reference 129 are only indicated for the conducting portions located at a single of the four corners of the cell 130) located at the same levels as the first, third and fifth arrays of lines 108, 116, 140 but which are not electrically connected to these conducting lines 108, 116, 140.

This cell 130 is of rectangular parallelepiped, or cubic, shape and has for example sides of dimension (along the X and Y axes) equal to around 5 µm. Within each of the arrays of conducting lines 108, 112, 116, 140, 142 and 144, the portions of the conducting lines have for example a width such that the cell 130 is in keeping with the minimum density of metal imposed by the design rule of the interconnection structure 102.

The conducting lines 108, 116 and 140 are for example intended to distribute a reference potential and the conducting lines 112, 142 and 144 are for example intended to distribute an electrical supply signal. In this cell 130, the reference potential and the electrical supply signal are accessible, for each of the arrays of conducting lines, at the four lateral faces of the cell 130. Thus, one or more conduction paths and/or one or more conducting planes enable the propagation of the reference potential and the supply signal may be constructed by juxtaposing several cells 130 one beside the other along the X axis and/or the Y axis, the electrical connections between the portions of conducting lines of different cells 130 being obtained by placing these cells 130 in lateral contact.

For example, the cell 130 of FIG. 6 makes it possible to obtain a capacitance of around 6.65 fF between the two sets of arrays of conducting lines distributing the two signals, that is to say between the first set formed by the portions of conducting lines 108, 116 and 140 and the second set formed by the portions of conducting lines 112, 142 and 144.

In a variant, it is possible that the structure 102 is used to distribute more than two different signals. It is for example possible that in an interconnection structure 102 comprising six superimposed arrays of conducting lines:
- the first, third and fifth arrays, of which the conducting lines are connected by first conducting vias, serve to distribute a same reference potential;
- the second and fourth arrays, of which the conducting lines are connected by second conducting vias, serve to distribute a first supply signal;
- a sixth array, of which the conducting lines are not connected to the second and fourth arrays by second conducting vias, serve to distribute a second supply signal.

Figure 7:
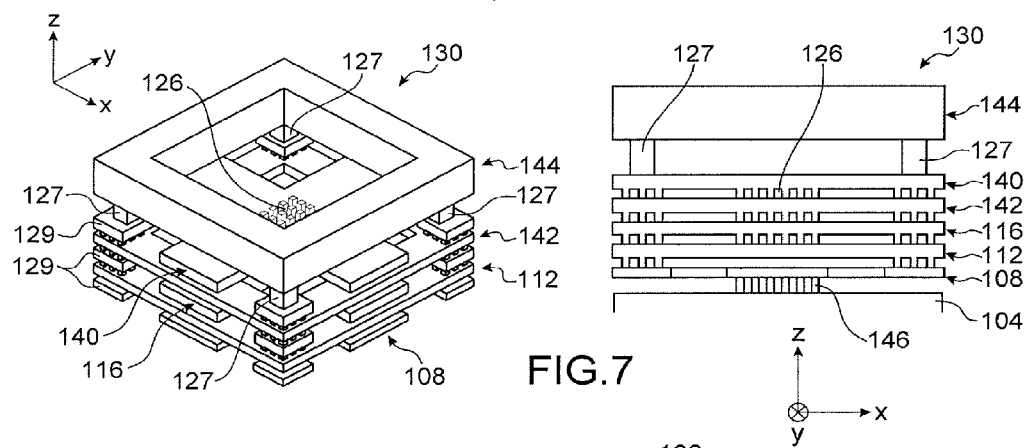

FIG. 7 shows another example of embodiment of a cell 130 enabling a distribution of three different electrical signals.

In this cell 130, the first array of conducting lines 108, which is the closest to the integrated circuit 104, is advantageously used to distribute the reference potential due to the fact that this first array can serve to polarise the semiconductor substrate of the integrated circuit 104 through conducting vias 146 connecting the first array of conducting lines 108 to the substrate. The second, fourth and sixth arrays of conducting lines 112, 142 and 144 are able to distribute a first electrical signal of potential different to the reference potential, these three arrays being electrically connected together by the second vias 127 formed at the corners of the cell 130. The third and fifth arrays of conducting lines 116 and 140 are able to distribute a second electrical signal of potential different to those of the first signal and the reference potential. To do so, no conducting via connects the portions of conducting lines 108 to the conducting lines 116 of the third array.

As may be seen in FIG. 7, the second conducting vias 127 connecting the second, fourth and sixth arrays of conducting lines 114, 142 and 144 are also connected to conducting portions 129 located at the same level as the conducting lines 108, 116 and 140 of the first, third and fifth arrays, these conducting portions 129 not being electrically connected to the conducting lines 108, 116 and 140. This makes it possible to add lateral parasitic capacitances between the first electrical signal distributed by the arrays of conducting lines 114, 142 and 144 and the reference potential distributed by the array of conducting lines 108, and thus increase the decoupling capacitance between these signals. This also makes it possible to add lateral parasitic capacitances between the first electrical signal distributed by the arrays of conducting lines 114, 142 and 144 and the second electrical signal distributed by the third and fifth arrays of conducting lines 116, 140, and thus increase the decoupling capacitance between these signals.

A parasitic capacitance also exists between the second signal distributed by the third and fifth arrays of conducting lines 116 and 140 and the reference potential distributed by the first array of conducting lines 108 on account of the empty space present at the centre of the square formed by the portions of conducting lines 112 and due to the fact that the portions of conducting lines 108 are superimposed on the portions of conducting lines 112.

Thus, in such a cell 130, a decoupling capacitance exists between all of the signals distributed by the cell 130, which makes it possible to have good stability of the continuous voltages distributed and to reduce the total impedance linked to the distribution of the electrical supply, polarisation or reference signals in the different conducting levels of the cell 130.

The cells 130 may comprise more arrays of superimposed conducting lines to distribute more different signals.

The conduction path(s) and/or the conducting plane formed in the interconnection structure 102 may be entirely produced by juxtaposing connection cells 130 as for example described in relation to FIG. 6 or 7.

It is sometimes necessary that in a conduction path or in a conducting plane, the distribution of one or more of the signals is interrupted intermittently or in a part of the structure 102. To do so, it is possible to resort to one or more connection cells 130 in which, at the level of one or more of the arrays of conducting lines, one or more portions of conducting lines are eliminated or are produced such that they do not reach one or more edges of the cell 130 in order that the distribution of one or more signals is interrupted at the level of this or these edges of the cell 130.

Figure 8:
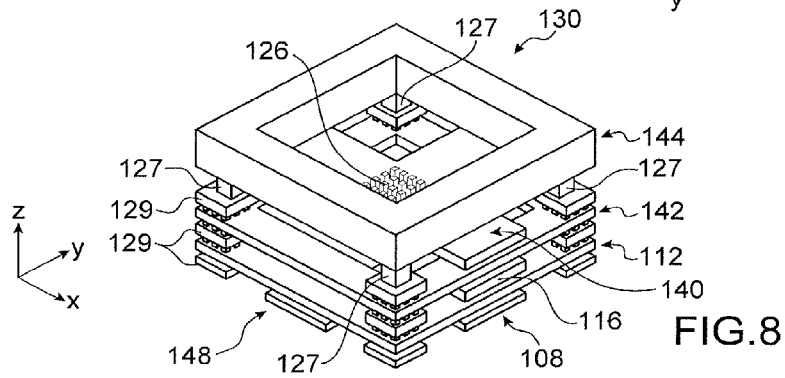

Such a cell 130 is for example shown in FIG. 8. In this figure, the portions of conducting lines 116 and 140 are partially etched such that they do not reach a lateral face 148 of the cell 130. Thus, if this cell is able to distribute a reference potential and two supply signals as described previously in relation to FIG. 7, the distribution of these three signals is ensured on all of the lateral faces of the cell 130 except at the lateral face 148 at the level of which the distribution of the signal routed by the arrays of conducting lines 116 and 140 is interrupted at this lateral face 148.

Figure 9:
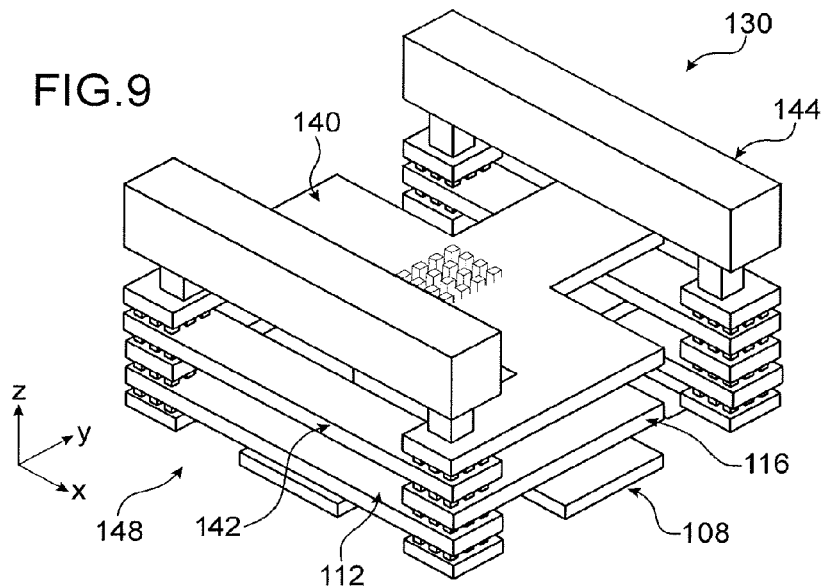

Other types of cells 130 may also be inserted in the conduction path(s) and/or the conducting plane(s) in order to modify the attribution of the levels of conducting lines of the structure 102 on which the signals are distributed. An example of embodiment of such a cell 130 is shown in FIG. 9. In this cell, the conducting lines 116 and 140 of the third and fifth levels form a "Y-shaped" pattern such that these lines are electrically connected to the conducting lines 112, 142 and 144 of the second, fourth and sixth arrays through conducting vias 127 produced at the four corners of the cell 130. In addition, the patterns formed by the conducting lines 112, 142 and 144 do not correspond to squares but to two separate portions not electrically connected together. Thus, with this cell 130, when its lateral face 148 receives a reference potential on the conducting lines 108, a first electrical signal on the conducting lines 112, 142 and 144 and a second electrical signal on the conducting lines 116 and 140, this cell enables the distribution, at the other lateral faces of the cell 130, of the reference potential on the conducting lines 108 and the second electrical signal on the conducting lines 116, 140.

Figure 10:
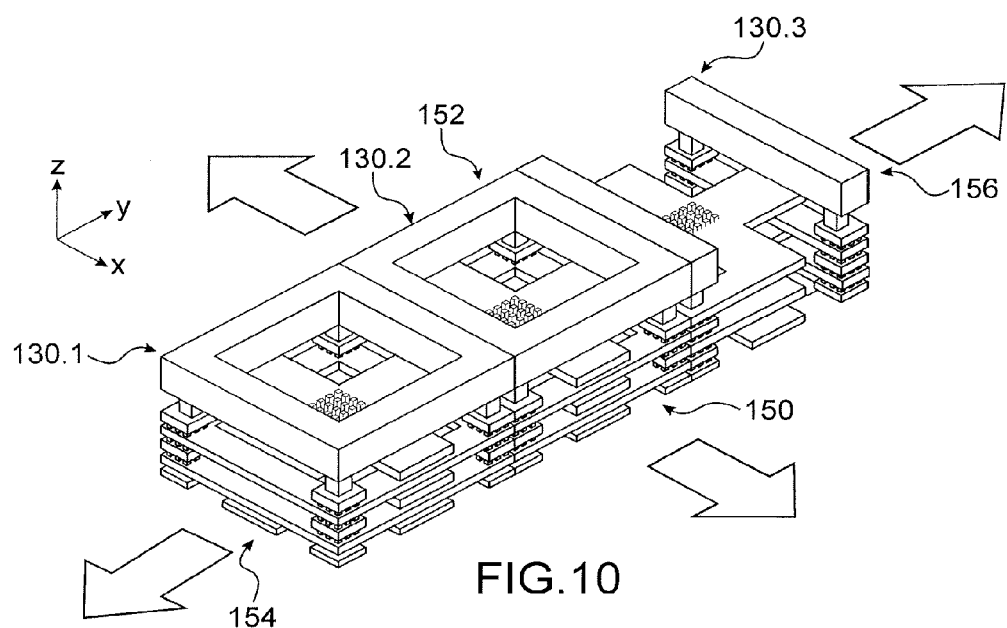
FIG. 10 shows an assembly of three juxtaposed connection cells forming a part of an interconnection structure of an electronic device.

FIG. 10 shows the juxtaposition of three cells 130.1, 130.2 and 130.3. The first cell 130.1 is similar to the cell 130 described previously in relation to FIG. 8, the second cell 130.2 is similar to the cell 130 described previously in relation to FIG. 7 and the third cell 130.3 is similar to that described previously in relation to FIG. 9. With such an assembly of cells 130, the distribution of the reference potential and of the two electrical supply signals is produced in the following manner:

- on the lateral faces 150 and 152 of the cells 130.1 and 130.2, the conducting lines 108 distribute the reference potential, the conducting lines 116 and 140 distribute the first electrical supply signal and the conducting lines 112, 142 and 144 distribute the second electrical supply signal;
- on the lateral face 154 of the cell 130.1, the conducting lines 108 distribute the reference potential, the conducting lines 112, 142 and 144 distribute the second electrical supply signal, and the conducting lines 116 and 140 does not distribute any signal;
- on the lateral faces 150, 152 and 156 of the cell 130.3, the conducting lines 108 distribute the reference potential, the conducting lines 116 and 140 distribute the second electrical supply signal, and the conducting lines 112, 142 and 144 does not distribute any signal.

The invention claimed is:

1. Electronic device comprising an electrical interconnection structure forming at least one electrical conduction path between at least two points of the electronic device and/or at least one electrically conducting plane, and comprising an alternating stack of arrays of conducting lines and dielectric layers in which:
    all the conducting lines of a same array extend in a same plane and form an equipotential;
    a first pattern of the conducting lines of a first array is such that at least one first of the conducting lines of the first array extends along at least one first direction and several second of the conducting lines of the first array intersect the first of the conducting lines of the first array at several intersections;
    a third pattern of the conducting lines of a third array is similar to the first pattern, the first and third patterns being superimposed one on top of the other and such that the intersections of the first pattern are aligned with intersections of the third pattern along an axis substantially perpendicular to the planes in which the conducting lines of the first and third arrays extend;
    a second pattern of conducting lines of a second array arranged between the first and third arrays of conducting lines is such that at least one first of the conducting lines of the second array extends along the first direction and several second of the conducting lines of the second array intersect the first of the conducting lines of the second array at several intersections offset with respect to the intersections of the first and third patterns;
    at least one first conducting via extends through at least one part of at least one of the dielectric layers interposed between the first and third arrays of conducting lines, is in contact with at least one of the conducting lines of the first array and/or of the third array and is such that a section of the first conducting via projected in a plane in which the conducting lines of the second array pass is not in contact with the conducting lines of the second array.

2. Electronic device according to claim 1, comprising several first conducting vias extending through the dielectric layers interposed between the first and third arrays of conducting lines and each electrically connecting one of the intersections of the first array of conducting lines to one of the intersections of the third array of conducting lines through a conducting portion of the second array which is electrically insulated from the conducting lines of the second array.

3. Electronic device according to claim 1, further comprising at least one second conducting via extending through at least one part of at least one of the dielectric layers interposed between the first and third arrays of conducting lines, in contact with at least one of the conducting lines of the second array and such that a section of the at least one second conducting via projected in a plane in which the conducting lines of the first array pass is not in contact with the conducting lines of the first array.

4. Electronic device according to claim 3, comprising several second conducting vias extending through the dielectric layers interposed between the first and third arrays of conducting lines, each being in contact with one of the intersections of the second array of conducting lines and with a conducting portion of the first array which is electrically insulated from the conducting lines of the first array and/or a conducting portion of the third array which is electrically insulated from the conducting lines of the third array.

5. Electronic device according to claim 1, in which the first and third patterns of the conducting lines of the first and third arrays correspond respectively to a first and a third grid layouts aligned and superimposed one on top of the other, and in which the second pattern of the conducting lines of the second array corresponds to a second grid layout offset with respect to the first and third grid layouts.

6. Electronic device according to claim 2, further comprising several second conducting vias extending through the dielectric layers interposed between the first and third arrays of conducting lines, each being in contact with one of the intersections of the second array of conducting lines and with a conducting portion of the first array which is electrically insulated from the conducting lines of the first array and/or a conducting portion of the third array which is electrically insulated from the conducting lines of the third array, and such that a section of each second conducting via projected in a plane in which the conducting lines of the first array pass is not in contact with the conducting lines of the first array,
    in which the first and third patterns of the conducting lines of the first and third arrays correspond respectively to a first and a third grid layouts aligned and superimposed one on top of the other, and in which the second pattern of the conducting lines of the second array corresponds to a second grid layout offset with respect to the first and third grid layouts,
    and in which the first conducting vias traverse openings formed in the second grid layout and the second conducting vias traverse openings formed in at least one of the first and third grid layouts.

7. Electronic device according to claim 1, in which the conducting lines of a same array intersect in a substantially perpendicular manner.

8. Electronic device according to claim 1, in which at least one of the first of the conducting lines of one of the arrays is interrupted.

9. Electronic device according to claim 1, further comprising one or more other arrays of conducting lines superimposed on the first, second and third arrays of conducting lines and of which the conducting lines form a similar pattern and aligned with the first or with the second pattern such that the patterns formed by the conducting lines of the one or more other arrays correspond to an alternating superposition of the first and second patterns.

10. Electronic device according to claim 1, further comprising at least one analogue integrated circuit and in which the interconnection structure forms ground and electrical supply planes of said at least one analogue integrated circuit.

11. Method for producing an electronic device comprising an electrical interconnection structure forming at least one electrical conduction path between at least two points of the electronic device and/or at least one electrically conducting plane, in which the method comprises a step of computer aided design of the electrical conduction path and/or of the electrically conducting plane from several similar connection cells each modelling a part of an alternating stack of arrays of conducting lines and dielectric layers in which:

all the conducting lines of a same array extend in a same plane and form an equipotential;

a first pattern of the conducting lines of a first array is such that at least one first of the conducting lines of the first array extends along at least one first direction and several second of the conducting lines of the first array intersect the first of the conducting lines of the first array at several intersections;

a third pattern of the conducting lines of a third array is similar to the first pattern, the first and third patterns being superimposed one on top of the other and such that the intersections of the first pattern are aligned with intersections of the third pattern along an axis substantially perpendicular to the planes in which the conducting lines of the first and third arrays extend;

a second pattern of the conducting lines of a second array arranged between the first and third arrays of conducting lines is such that at least one first of the conducting lines of the second array extends along the first direction and several second of the conducting lines of the second array intersect the first of the conducting lines of the second array at several intersections offset with respect to the intersections of the first and third patterns;

at least one first conducting via extends through at least one part of at least one of the dielectric layers interposed between the first and third arrays of conducting lines, is in contact with at least one of the conducting lines of the first array and/or of the third array and such that a section of the first conducting via projected in a plane in which the conducting lines of the second array pass is not in contact with the conducting lines of the second array;

and in which, during the step of computer aided design of the electrical conduction path and/or of the electrically conducting plane, a plurality of connection cells are juxtaposed and placed in contact laterally with each other to form the electrical conduction path and/or the electrically conducting plane.

12. Method according to claim 11, in which the first and third patterns of the conducting lines of the first and third arrays correspond to a first and a third grid layouts aligned one on top of the other, and in which the second pattern of the conducting lines of the second array corresponds to a second grid layout offset with respect to the first and third grid layouts.

13. Method according to claim 11, in which each of the connection cells is such that at least one of the conducting lines of each of the arrays extends between a first corner or a first edge of the connection cell and a second corner or a second edge of the connection cell.

14. Method according to claim 11, in which each of the connection cells comprises at least one part of the first of the conducting lines and at least one of the second of the conducting lines of each of the arrays.

* * * * *